(12) United States Patent
Mei et al.

(10) Patent No.: US 11,877,461 B2
(45) Date of Patent: Jan. 16, 2024

(54) LIGHT EMITTING DIODE DEVICE, DISPLAY PANEL, DISPLAY DEVICE, AND MANUFACTURING METHOD

(71) Applicant: BOE Technology Group Co., Ltd., Beijing (CN)

(72) Inventors: Wenhai Mei, Beijing (CN); Yichi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/296,839

(22) PCT Filed: Aug. 20, 2020

(86) PCT No.: PCT/CN2020/110338
§ 371 (c)(1),
(2) Date: May 28, 2021

(87) PCT Pub. No.: WO2022/036652
PCT Pub. Date: Feb. 24, 2022

(65) Prior Publication Data
US 2023/0354630 A1    Nov. 2, 2023

(51) Int. Cl.
*H10K 50/115* (2023.01)
*H10K 50/16* (2023.01)
*H10K 50/15* (2023.01)
*H10K 85/40* (2023.01)
*H10K 85/10* (2023.01)
*C09K 11/06* (2006.01)
*H10K 71/80* (2023.01)

(52) U.S. Cl.
CPC ............ *H10K 50/115* (2023.02); *C09K 11/06* (2013.01); *H10K 50/15* (2023.02); *H10K 50/16* (2023.02); *H10K 71/80* (2023.02); *H10K 85/141* (2023.02); *H10K 85/40* (2023.02); *C09K 2211/14* (2013.01)

(58) Field of Classification Search
CPC .................................................... H10K 50/115
See application file for complete search history.

(56) References Cited

U.S. PATENT DOCUMENTS

2023/0257650 A1* 8/2023 Zhang .................... H10K 85/00
257/40

\* cited by examiner

*Primary Examiner* — Yu-Hsi D Sun
(74) *Attorney, Agent, or Firm* — Workman Nydegger

(57) ABSTRACT

Embodiments of the present disclosure provide a light emitting diode device, a display panel, a display device, and a manufacturing method. The light emitting diode device includes: a base substrate; a first electrode disposed on one side of the base substrate; a carrier functional layer disposed on one side, facing away from the base substrate, of the first electrode; a quantum dot light emitting layer disposed on one side, facing away from the first electrode, of the carrier functional layer, having a molecular chain structure inside, where the molecular chain structure is formed by atom transfer radical polymerization of a first reactant and a modified molecule, the first reactant undergoes atom transfer radical polymerization with the modified molecule through a ligand molecule A, and in an initial state, the modified molecule is connected to one surface, facing the quantum dot light emitting layer, of the carrier functional layer; and a second electrode disposed on one side, facing away from the carrier functional layer, of the quantum dot light emitting layer.

20 Claims, 5 Drawing Sheets

LIGHT EMITTING DIODE DEVICE, DISPLAY PANEL, DISPLAY DEVICE, AND MANUFACTURING METHOD

CROSS REFERENCE TO RELATED APPLICATIONS

The present disclosure is a national phase entry under 35 U.S.C. § 371 of International Application No. PCT/CN2020/110338, filed on Aug. 20, 2020, the entire content of which is incorporated herein by reference.

FIELD

The present disclosure relates to the field of semiconductor technology, in particular to a light emitting diode device, a display panel, a display device, and a manufacturing method.

BACKGROUND

With continuous development and evolution of nano science and technology, the preparation of a nanomaterial with a specific patterned structure has gradually become an increasingly important research direction in the research field of modern nano science and technology. As a novel nanomaterial, i.e., quantum dots, has attracted earnest attention of many researchers due to many advantages since it came out. What's more, the successful preparation of a quantum dot layer with a specific pattern has caused another wave of research in the nano field while expanding its application range. A Quantum Dots Light Emitting Diode Display (QLED) is a novel display technology developed on the basis of an organic light emitting display. A difference therebetween is that a light emitting layer in the QLED is a quantum dot layer, with a principle that electrons/holes are injected into the quantum dot layer through an electron/hole transport layer, and the electrons and holes are recombined in the quantum dot layer to emit light. Compared with the organic light emitting diode display device, the QLED has the advantages of narrow luminescence peak, high color saturation, wide color gamut, and the like.

SUMMARY

An embodiment of the present disclosure provides a light emitting diode device, including:
 a base substrate;
 a first electrode disposed on one side of the base substrate;
 a carrier functional layer disposed on one side, facing away from the base substrate, of the first electrode;
 a quantum dot light emitting layer disposed on one side, facing away from the first electrode, of the carrier functional layer, having a molecular chain structure inside, wherein the molecular chain structure is formed by atom transfer radical polymerization of a first reactant and a modified molecule, the first reactant includes a quantum dot body and a ligand molecule A connected to the quantum dot body, the first reactant undergoes the atom transfer radical polymerization with the modified molecule through the ligand molecule A, and in an initial state, the modified molecule is connected to one surface, facing the quantum dot light emitting layer, of the carrier functional layer; and
 a second electrode disposed on one side, facing away from the carrier functional layer, of the quantum dot light emitting layer.

In one embodiment, a general formula of the ligand molecule A is:

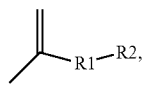

where R1 is an electron-donating group, and R2 is a solubility-enhancing group.

In one embodiment, R1 includes one of:

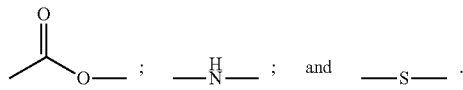

In one embodiment, R2 includes one of:

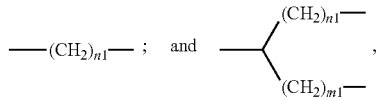

where $1 \leq n1 \leq 8$, and $1 \leq m1 \leq 8$.

In one embodiment, a general formula of the modified molecule is:

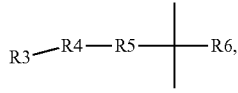

where R3 is a group coupled to the surface of the carrier functional layer, R6 is a halogenated group, and R5 is an electron-donating group.

In one embodiment, R3 includes one of:

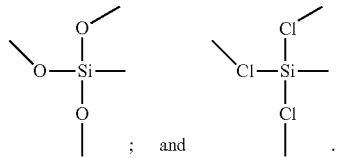

In one embodiment, R6 includes one of:
—Cl;
—Br; and
—I.

In one embodiment, R5 includes one of:

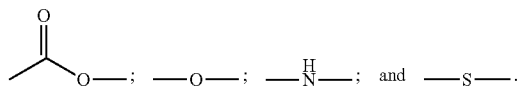

In one embodiment, R4 includes one of:

—$(CH_2)_{n2}$—, where $1 \leq n2 \leq 12$.

In one embodiment, the first reactant includes a ligand molecule B, and a general formula of ligand molecule B is:

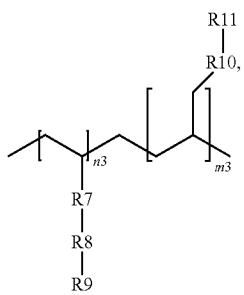

where 1≤n3≤12, 1≤m3≤12, R9 is a group coordinated with the quantum dot body, and R11 is a group that forms a hydrogen bond with a transfer substrate when the quantum dot light emitting layer is transfer-printed.

In one embodiment, R9 includes one of:

—NH₂;

—SH; and

—COOH.

In one embodiment, R11 includes one of:

—CHO;

—OH; and

—COOH.

In one embodiment, R7 includes one of:

—O—;

—N—;

—C—; and

—S—.

In one embodiment, R8 includes one of:

—(CH₂)$_a$—, where a=1, 2, 3 or 4.

In one embodiment, R10 includes one of:

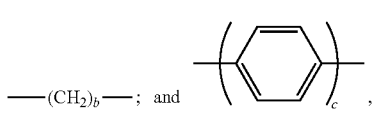

where 1≤b≤8, and c=1 or 2.

In one embodiment, a structure of the quantum dot body connected with the ligand molecule A is:

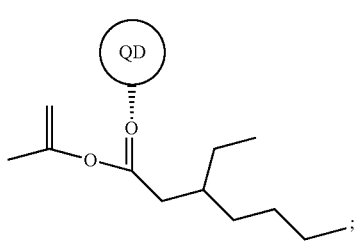

the modified molecule is:

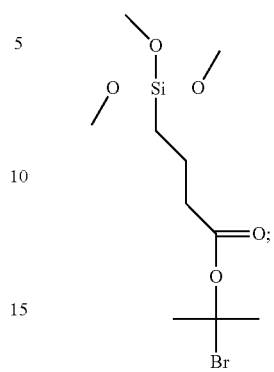

and a chain initiation reaction on a surface, facing the carrier functional layer, of the quantum dot light emitting layer is:

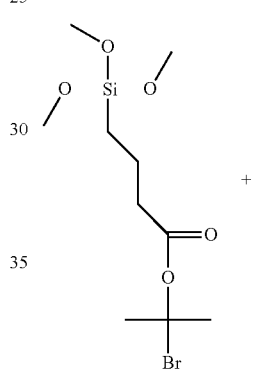

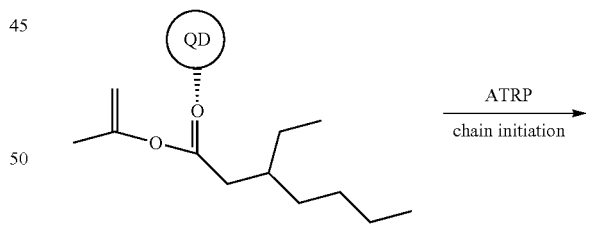

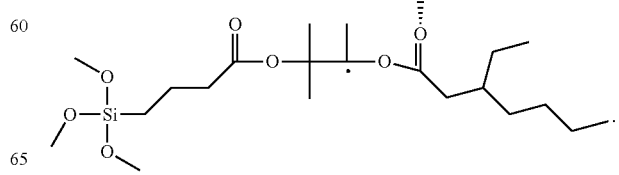

In one embodiment, the structure of the molecular chain structure is:

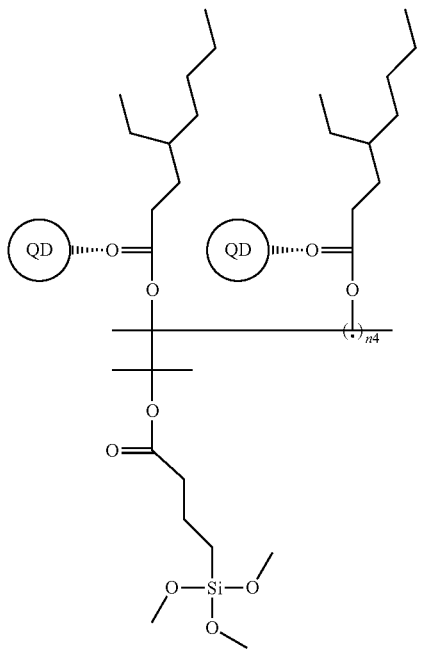

where n4≥1; and a chain propagation reaction inside the quantum dot light emitting layer is:

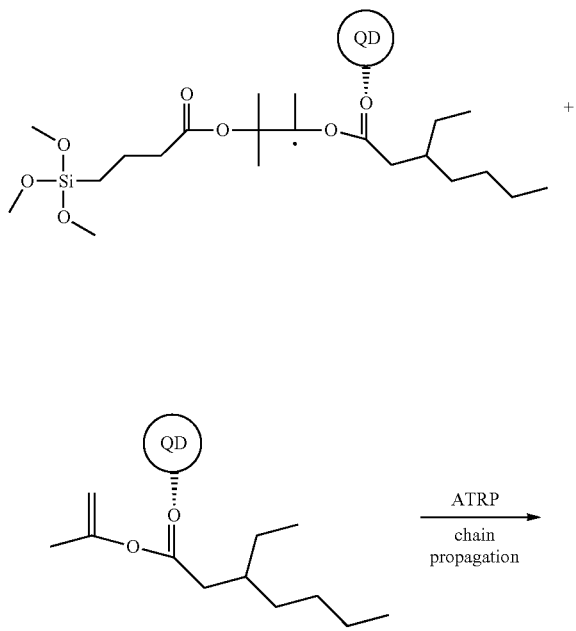

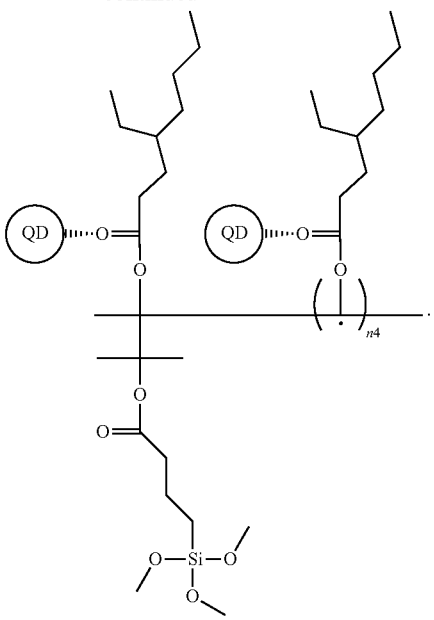

In one embodiment, a material of the carrier functional layer is an inorganic metal oxide, and a surface of the inorganic metal oxide has a hydroxyl group.

In one embodiment, the first electrode is a cathode, the second electrode is an anode, and the carrier functional layer is an electron transport layer, a material of the electron transport layer is zinc oxide;

or the first electrode is an anode, the second electrode is a cathode, the carrier functional layer is a hole transport layer, and a material of the hole transport layer is nickel oxide.

An embodiment of the present disclosure further provides a display panel, which includes the light emitting diode device as provided by the embodiment of the present disclosure.

An embodiment of the present disclosure further provides a display device, which includes the display panel as provided by the embodiment of the present disclosure.

An embodiment of the present disclosure further provides a manufacturing method of a light emitting diode device, including:

forming a quantum dot film layer including a first reactant on a carrier substrate, where the first reactant includes a quantum dot body, a ligand molecule A connected to the quantum dot body, and a ligand molecule B connected to the quantum dot body;

contacting a transfer substrate with the quantum dot film layer to form a hydrogen bond between the ligand molecule B in the first reactant and the transfer substrate, and to adhere up the quantum dot film layer;

bonding the transfer substrate with the quantum dot film layer to a base substrate formed with a modified molecule to undergo atom transfer radical polymerization between the ligand molecule A in the first reactant on a surface of the quantum dot film layer and the modified molecule, and to undergo continuous atom transfer radical polymerization inside the quantum dot film layer to form a quantum dot light emitting layer, where the base substrate is formed with a first electrode and a carrier functional layer on one side, facing away from the base substrate, of the first electrode, and the modified molecule is connected to one surface, facing away from the first electrode, of the carrier functional layer;

removing the transfer substrate; and forming a second electrode.

In one embodiment, the forming the quantum dot film layer including the first reactant on the carrier substrate includes:

forming an initial quantum dot film layer with an initial ligand on the carrier substrate; and applying a solution containing the ligand molecule A and the ligand molecule B on the carrier substrate formed with the initial quantum dot film layer to undergo a ligand exchange reaction between the ligand molecule A, the ligand molecule B, and the initial ligand.

In one embodiment, the forming the initial quantum dot film layer with the initial ligand on the carrier substrate includes:

treating a silicon-based substrate with trimethoxyoctadecylsilane; and forming the initial quantum dot film layer with an oleic acid ligand on the silicon-based substrate.

In one embodiment, before bonding the transfer substrate with the quantum dot film layer to the base substrate formed with the carrier functional layer connected with the modified molecule, the manufacturing method further includes:

providing the base substrate;

forming the carrier functional layer on one side of the base substrate; and applying a solution containing the modified molecule on a surface of the carrier functional layer to couple the modified molecule to a hydroxyl group on the surface of the carrier functional layer.

In one embodiment, after adhering up the quantum dot film layer and before bonding the transfer substrate with the quantum dot film layer to the base substrate formed with the modified molecule, the manufacturing method further includes:

contacting the transfer substrate bonded with the quantum dot film layer with a grooved intaglio to form a patterned quantum dot film layer.

In one embodiment, when bonding the transfer substrate with the quantum dot film layer to the base substrate formed with the modified molecule, the manufacturing method further includes:

immersing the bonded transfer substrate and base substrate in an anisole solution of cuprous chloride.

In one embodiment, contacting the transfer substrate with the quantum dot film layer includes:

contacting the transfer substrate made of polydimethylsiloxane with the quantum dot film layer.

DETAILED DESCRIPTION OF THE EMBODIMENTS

To make the objectives, technical solutions and advantages of the embodiments of the present disclosure clearer, the technical solutions in the embodiments of the present disclosure will be described clearly and completely in conjunction with the accompanying drawings in the embodiments of the present disclosure. Obviously, the described embodiments are only a part of the embodiments of the present disclosure, and not all the embodiments. Based on the embodiments described herein, all other embodiments obtained by those ordinary skilled in the art without creative work shall fall into the protection scope of the present disclosure.

Unless otherwise defined, technical or scientific terms used in the present disclosure shall have ordinary meanings understood by those ordinary skilled in the art to which the present disclosure pertains. The words "first", "second" and the like used in present disclosure do not indicate any order, quantity or importance, but are only used to distinguish different components. The words such as "comprise" or "include" and the like means that an element or object appearing before such a word covers listed elements or objects appearing after the word and equivalents thereof, and does not exclude other elements or objects. The words such as "connected" or "connecting" and the like are not limited to physical or mechanical connections, but may include electrical connection, either direct or indirect. The words such as "up", "down", "left", "right" and the like are only used to indicate a relative positional relationship. When the absolute position of a described object is changed, the relative positional relationship may also be changed accordingly.

To keep the following description of the embodiments of the present disclosure clear and concise, detailed description of known functions and known components is omitted in the present disclosure.

Figure 1:
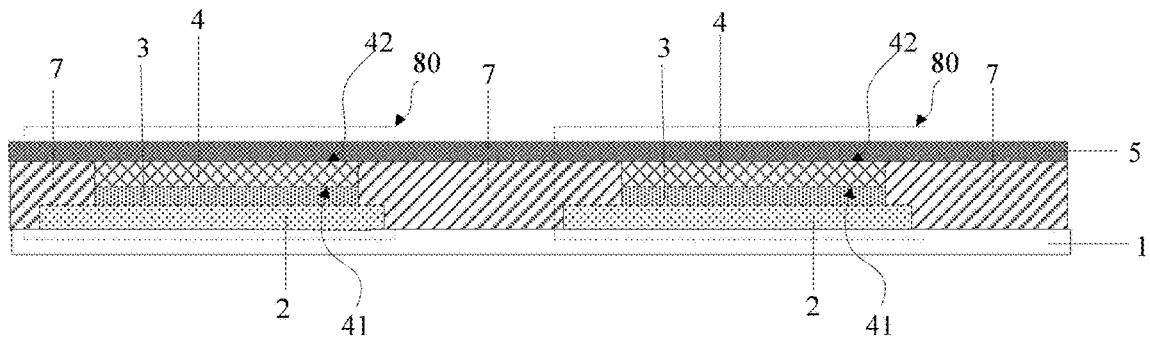
FIG. 1 is a schematic structural diagram of a light emitting diode device provided in an embodiment of the present disclosure.
Figure 2:
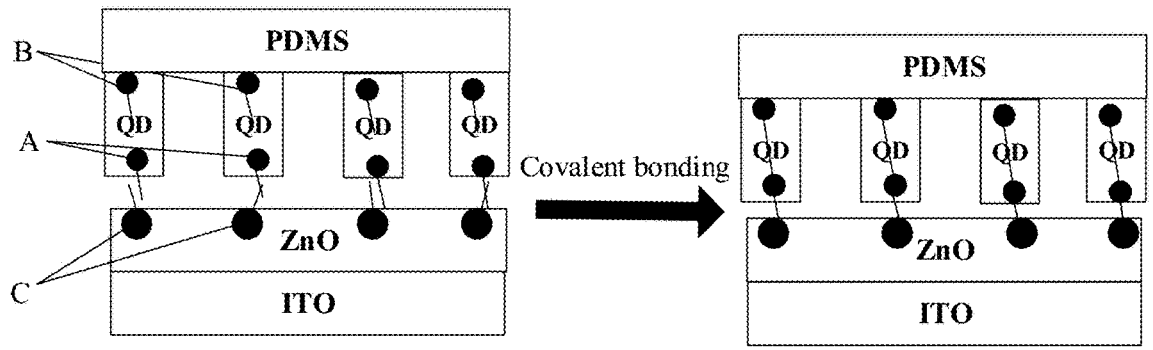
FIG. 2 is a schematic diagram of combination of a ligand of a quantum dot film layer and a modified molecule C of a base substrate, as provided in an embodiment of the present disclosure.

Referring to FIG. 1, an embodiment of the present disclosure provides a light emitting diode device, including:

a base substrate 1;

a first electrode 2 disposed on one side of the base substrate 1, where the first electrode 2 may include a plurality of structures spaced apart from each other;

a carrier functional layer 3 disposed on one side, facing away from the base substrate 1, of the first electrode 2, where the carrier functional layer 3 may include a plurality of structures spaced apart from each other and corresponding to the first electrode 2, and an orthographic projection of the first electrode 2 on the base substrate 1 may cover an orthographic projection of the corresponding carrier functional layer 3 on the base substrate. In one embodiment, the light emitting diode device may also have a barrier wall 7 configured to separate sub light emitting devices 80 with different colors of emergent light (as shown in FIG. 1, two sub light emitting devices 80 may be included: a sub light emitting device 80 on the left and a sub light emitting device 80 on the right. Each sub light emitting device 80 includes the first electrode 2, the carrier functional layer 3, a quantum dot light emitting layer 4, and a second electrode 5. Of course, FIG. 1 is only illustrative with an example of a light emitting diode device having two sub light emitting devices 80. In some embodiments, the light emitting diode device may have more sub light emitting devices 80, and the embodiments of the present disclosure are not limited thereto);

a quantum dot light emitting layer 4 disposed on one side, facing away from the first electrode 2, of the carrier functional layer 3, having a molecular chain structure X inside. The molecular chain structure X is formed by Atom Transfer Radical Polymerization (ATRP) of a first reactant and a modified molecule C. As shown in FIG. 2, polydimethylsiloxane (PDMS) is a transfer substrate used in transfer printing of the quantum dot light emitting layer, ZnO is used as the material of the carrier functional layer 3, indium tin oxide (ITO) is used as the material of the first electrode 2, the first reactant includes a quantum dot body QD and a ligand molecule A connected to the quantum dot body QD, the first reactant undergoes atom transfer radical polymerization with the modified molecule C through the ligand molecule A. In an initial state, the modified molecule C is connected to one surface, facing the quantum dot light emitting layer 4, of the carrier functional layer 3. That is, before the atom transfer radical polymerization, the modified molecule C may be firstly formed on the surface, facing the quantum dot light emitting layer 4, of the carrier functional layer 3. The quantum dot light emitting layer 4 is a film layer with the first reactant, and when the carrier functional layer 3 is brought into contact with the quantum dot light emitting layer 4 in a mode of transfer printing of the quantum dot light emitting layer, as the ligand molecule A in the first reactant may undergo atom transfer radical polymerization with the modified molecule C, the first reactant on the surface of the quantum dot light emitting layer 4 may be firstly combined with the modified molecule C, and as the atom transfer radical polymerization further occurs, the first reactant inside the quantum dot light emitting layer 4 also forms the molecular chain structure through the reaction, such that the entire quantum dot light emitting layer 4 is formed integrally into a whole structure in which the molecular chain structures X are combined with each other. The quantum dot body may be made of a conventional quantum dot light emitting material; and a second electrode 5 disposed on one side, facing away from the carrier functional layer 3, of the quantum dot light emitting layer 4, where the second electrode 5 may be of a whole-layer structure. Of course, the second electrodes 5 may also include structures spaced from each other.

According to the light emitting diode device provided in the embodiment of the present disclosure, the quantum dot light emitting layer 4 has the molecular chain structure X formed therein by atom transfer radical polymerization of the first reactant and the modified molecule C. That is, a first surface 41, facing the carrier functional layer 3, of the quantum dot light emitting layer 4, a second surface 42, facing the second electrode 5, of the quantum dot light emitting layer 4, and a region between the first surface 41 and the second surface 42 all have the molecular chain structures X, and the entire quantum dot light emitting layer 4 is formed integrally into a whole structure in which the molecular chain structures X are combined with each other. When the quantum dot light emitting layer 4 is transfer-printed from an original carrier substrate to the base substrate 1 of the light emitting diode device in a transfer printing mode by using the transfer substrate, the quantum dot light emitting layer 4 may, as an integral structure, be transfer-printed from the transfer substrate to the base substrate 1 all together, thereby improving the problem that when a quantum dot light emitting layer 4 in the prior art only has a quantum dot body, only part of the quantum dot light emitting layer on one surface of a transfer substrate can be transfer-printed to a base substrate, resulting in a low transfer yield of a light emitting diode device.

In some embodiments, the structure of the ligand molecule A is characterized by the presence of styrene and a derivative thereof, acrylate and a derivative thereof, acrylamide and a derivative thereof, acrylonitrile and the like. In some embodiments, a general formula of the ligand molecule A is:

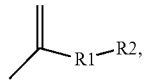

where R1 is an electron-donating group, and R2 is a solubility-enhancing group. In the embodiment of the present disclosure, the ligand molecule A is

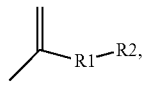

electrons can be provided for the ATRP reaction by the R1, which is beneficial to the ATRP reaction, and R2 may increase the solubility, which is beneficial for producing the ligand molecule A on the quantum dot body QD. In some embodiments, it can be a structure other than R2 in the ligand molecule A containing styrene and a derivative thereof, acrylate and a derivative thereof, acrylamide and a derivative thereof, acrylonitrile and the like.

In some embodiments, R1 may include one of:

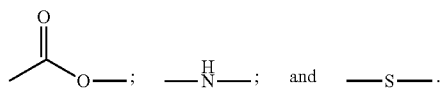

In some embodiments, R2 includes one of:

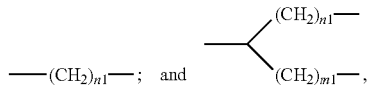

where $1 \leq n1 \leq 8$, and $1 \leq m1 \leq 8$.

In some embodiments, a general formula of the modified molecule C is:

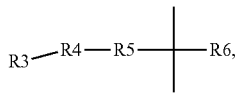

where R3 is a group that is coupled to the surface of the carrier functional layer, R6 is a halogenated group, and R5 is an electron-donating group. In the embodiment of the present disclosure, one end of the modified molecule C contains an R3 group, and may be coupled to the surface of the carrier functional layer 3. In some embodiments, the surface of the carrier functional layer may have a hydroxyl group, and R3 may be a group that can be coupled to the hydroxyl group; and the R6 halogenated group and the R5 electron-donating group can implement the ATRP reaction with the ligand molecule A of the quantum dot light emitting layer 4.

In some embodiments, R3 includes one of:

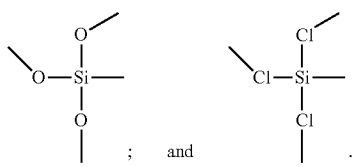

In some embodiments, R6 includes one of: —Cl; —Br; and —I.

In some embodiments, R5 includes one of:

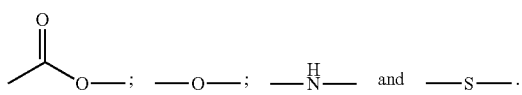

In some embodiments, R4 includes one of: $-(CH_2)_{n2}-$, where $1 \leq n2 \leq 12$. R4 enables the modified molecule C to have a certain length, and may have a solubilizing function.

In some embodiments, the first reactant includes a ligand molecule B, and a general formula of ligand molecule B is:

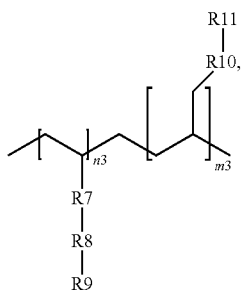

where $1 \leq n3 \leq 12$, $1 \leq m3 \leq 12$.

R9 is a group coordinated with the quantum dot body, and R11 is a group that forms a hydrogen bond with the transfer substrate when the quantum dot light emitting layer is transfer-printed. In the embodiment of the present disclosure, the first reactant further includes the ligand molecule B, and the ligand molecule B has a group R9 that can be coordinated with the quantum dot body, such that one end can be connected to the quantum dot body, and the ligand molecule has a group R11 that forms a hydrogen bond with the transfer substrate, such that combination with the transfer substrate can be implemented to adhere up the quantum dot light emitting layer from the original carrier substrate. It is to be noted that a binding force of a covalent bond formed by the ATRP reaction between the ligand molecule A of the quantum dot light emitting layer and the carrier functional layer 3 is greater than a binding force of the hydrogen bond formed between the quantum dot light emitting layer 4 and the transfer substrate through the ligand molecule B, and thus the quantum dot light emitting layer 4 can be transferred from the transfer substrate to the base substrate. In addition, the binding force of the hydrogen bond formed between the quantum dot light emitting layer 4 and the transfer substrate through the ligand molecule B is greater than a binding force between the quantum dot light emitting layer 4 and the original carrier substrate, such that the quantum dot light emitting layer 4 can be transferred from the carrier substrate to the transfer substrate.

In some embodiments, R9 includes one of: —NH$_2$; —SH; and —COOH.

In some embodiments, R11 includes one of: —CHO; —OH; and —COOH.

In some embodiments, R7 includes one of: —O—; —N—; —C—; and —S—. In the embodiment of the present disclosure, R7 may be an atom that connects a main chain and a branched chain, and thus acts as linker.

In some embodiments, R8 includes one of: $-(CH_2)_a-$, where $a=1, 2, 3$ or $4$. In the embodiment of the present disclosure, R8 is a branched chain, enables the ligand molecule B to have a certain length, and has a solubilizing function.

In some embodiments, R10 includes one of: $-(CH_2)_b-$; and

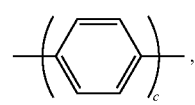

where $1 \leq b \leq 8$, and $c=1$ or $2$. In the embodiment of the present disclosure, R10 is an alkane or aromatic group, and has a solubilizing function.

In some embodiments, the structure of the quantum dot body connected with the ligand molecule A may be (that is, the structure formed after the quantum dot body and the ligand molecule A are connected):

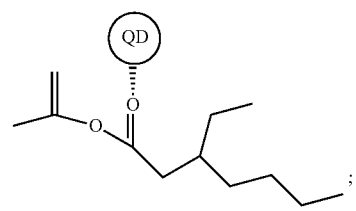

the modified molecule C may be:

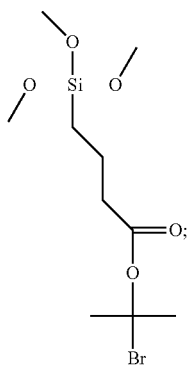

and a chain initiation reaction on the surface, facing the carrier functional layer 3, of the quantum dot light emitting layer 4 is:

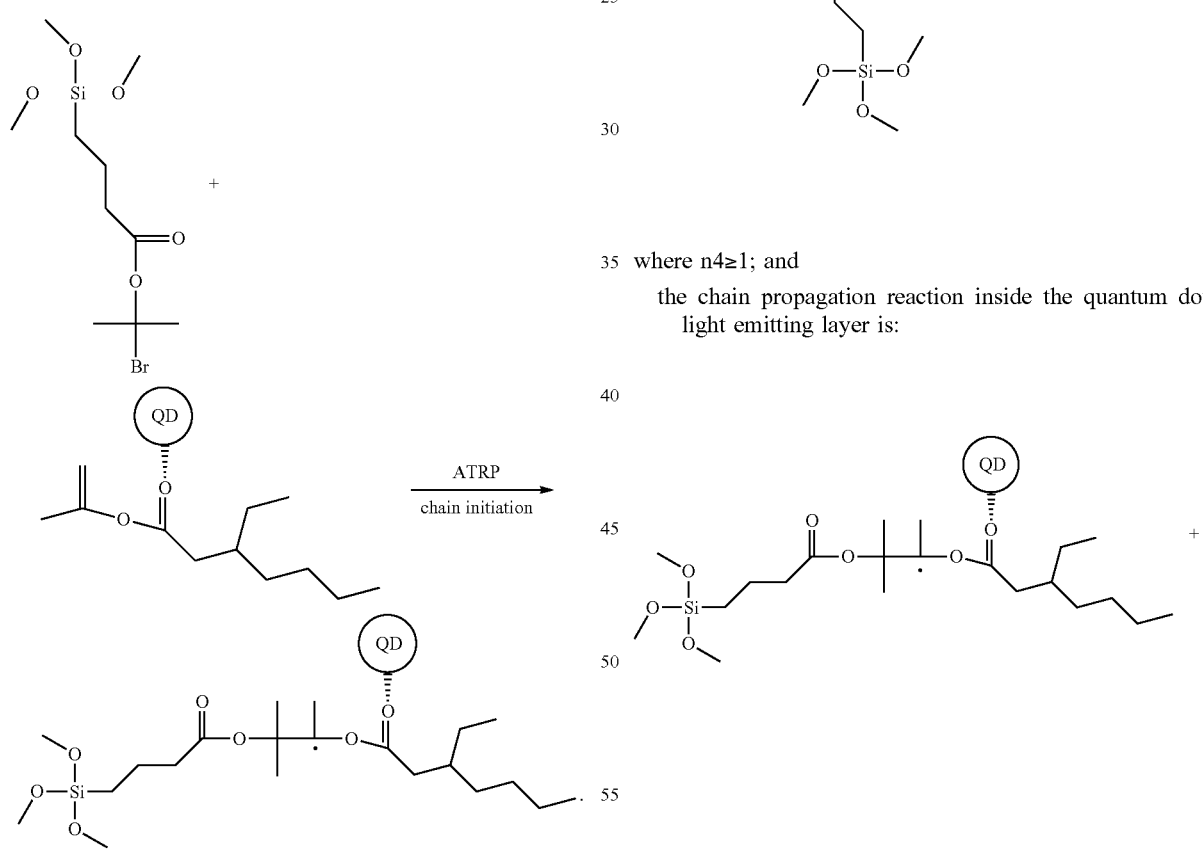

In the embodiment of the present disclosure, the structure of the quantum dot body connected with the ligand molecule A and the structure of the modified molecule C may cause the above-mentioned chain initiation reaction on the surface between the quantum dot light emitting layer 4 and the carrier functional layer 3, and the following chain propagation reaction inside the quantum dot light emitting layer 4.

In some embodiments, the structure of the molecular chain structure is:

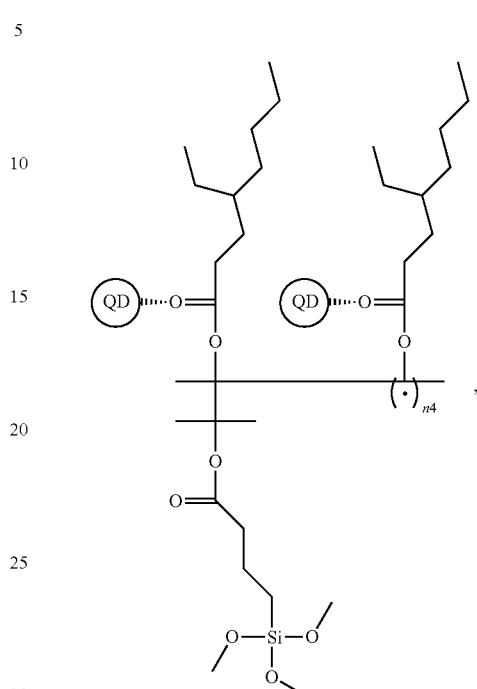

where n4≥1; and the chain propagation reaction inside the quantum dot light emitting layer is:

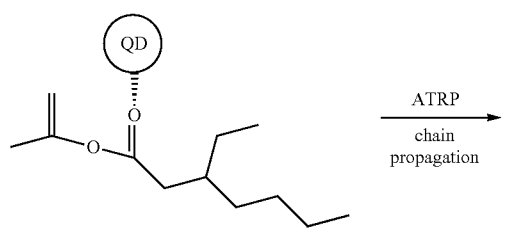

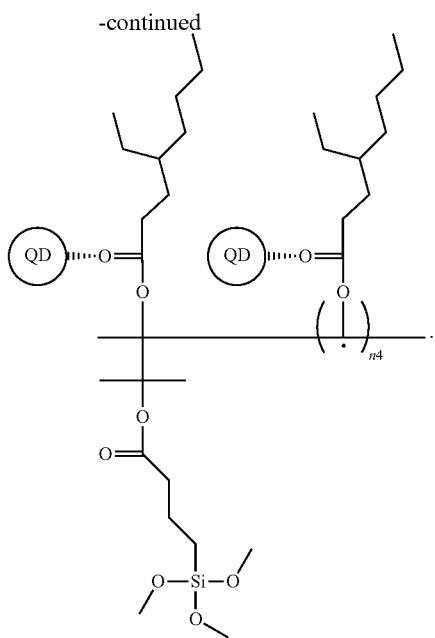

In some embodiments, the material of the carrier functional layer 3 may be an inorganic metal oxide, and the surface of the inorganic metal oxide has a hydroxyl group, such that the modified molecule C can be bound to the surface of the carrier functional layer 3.

In some embodiments, as shown in FIG. 1, the light emitting diode device in the embodiment of the present disclosure may be of either an inverted structure or an upright structure, which is described below with examples.

For example, the light emitting diode device is of the inverted structure, the first electrode 2 is a cathode, the second electrode 5 is an anode, and the carrier functional layer 3 is an electron transport layer, the material of which is zinc oxide.

As another example, the light emitting diode device is of the upright structure, the first electrode 2 is an anode, the second electrode 5 is a cathode, and the carrier functional layer 3 is a hole transport layer, the material of which is nickel oxide.

Based on the same inventive concept, an embodiment of the present disclosure further provides a display panel, which includes the light emitting diode device as provided in the embodiment of the present disclosure.

Figure 3:
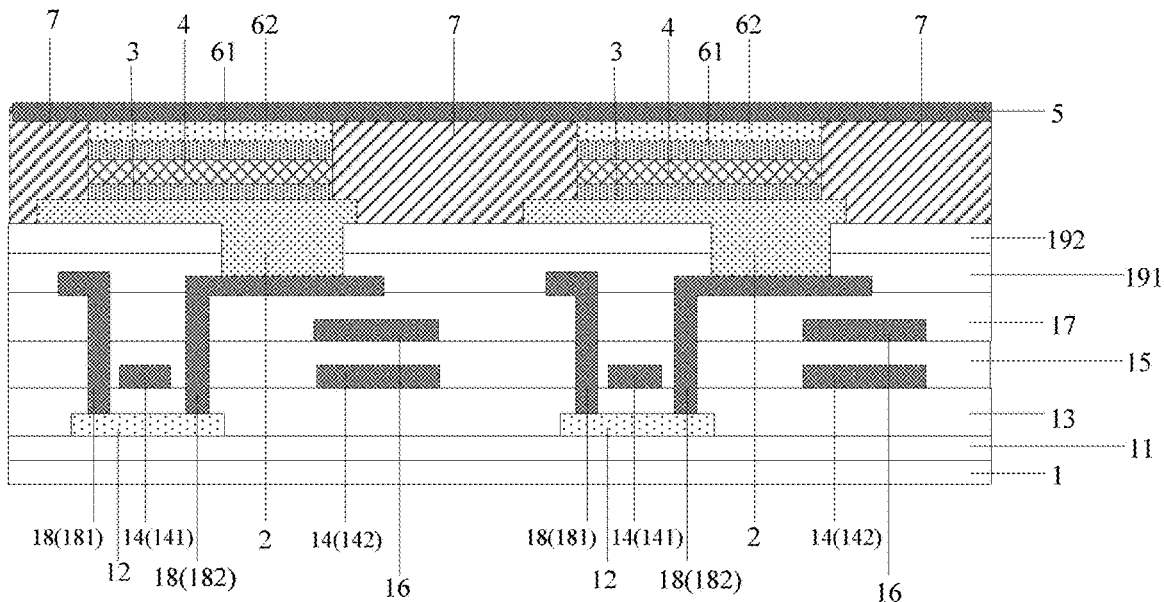
FIG. 3 is a schematic diagram of a display panel provided in an embodiment of the present disclosure.

In some embodiments, the display panel further includes a thin film transistor, the thin film transistor being electrically connected to the sub light emitting device 80. The thin film transistor may be an a-Si transistor, an oxide transistor, or a low temperature polysilicon transistor. The thin film transistor may be a top-gate thin film transistor or a bottom-gate thin film transistor. In conjunction with FIG. 3, the thin film transistor includes a gate 141, an active layer 12, and a source-drain layer 18 (which may include a source 181 and a drain 182). The gate 141 may be located on one side, facing away from the base substrate 1, of the active layer 12, and the source-drain layer 18 is located on one side, facing away from the base substrate 1, of the active layer 12, and is electrically connected to the sub light emitting device 80 through the drain 182. Further, the display panel further includes a first storage capacitor electrode 142 and a second storage capacitor electrode 16, the first storage capacitor electrode 142 and the gate 141 being arranged in a same layer 14, and the second storage capacitor electrode 16 being arranged separately and located between the first storage capacitor electrode 142 and the source-drain layer 18. Further, a plurality of insulating layers may also be disposed between the active layer 12 and the source-drain layer 18. For example, the plurality of insulating layers include: a first insulating layer 13 disposed between the active layer 12 and the gate 141, a second insulating layer 15 disposed between the gate 141 and the second storage capacitor electrode 16, and an interlayer dielectric layer 17 disposed between the source-drain layer 18 and the second storage capacitor electrode 16. Further, a passivation layer 191 may also be disposed between the source-drain layer 18 and the first electrode 2, and a planarization layer 192 may also be disposed between the passivation layer 191 and the first electrode 2. Further, a buffer layer 11 may also be provided between the base substrate 1 and the active layer 12.

When the light emitting diode device is of the inverted structure, a hole transport layer 61 is further formed between the quantum dot light emitting layer 4 and the second electrode 5, and a hole injection layer 62 is formed between the hole transport layer 61 and the second electrode 5. When the light emitting diode device is of the upright structure, an electron transport layer 61 is further formed between the quantum dot light emitting layer 4 and the second electrode 5, and an electron injection layer 62 is formed between the electron transport layer 61 and the second electrode 5.

Based on the same inventive concept, an embodiment of the present disclosure further provides a display device, which includes the display panel as provided in the embodiment of the present disclosure.

Figure 4:
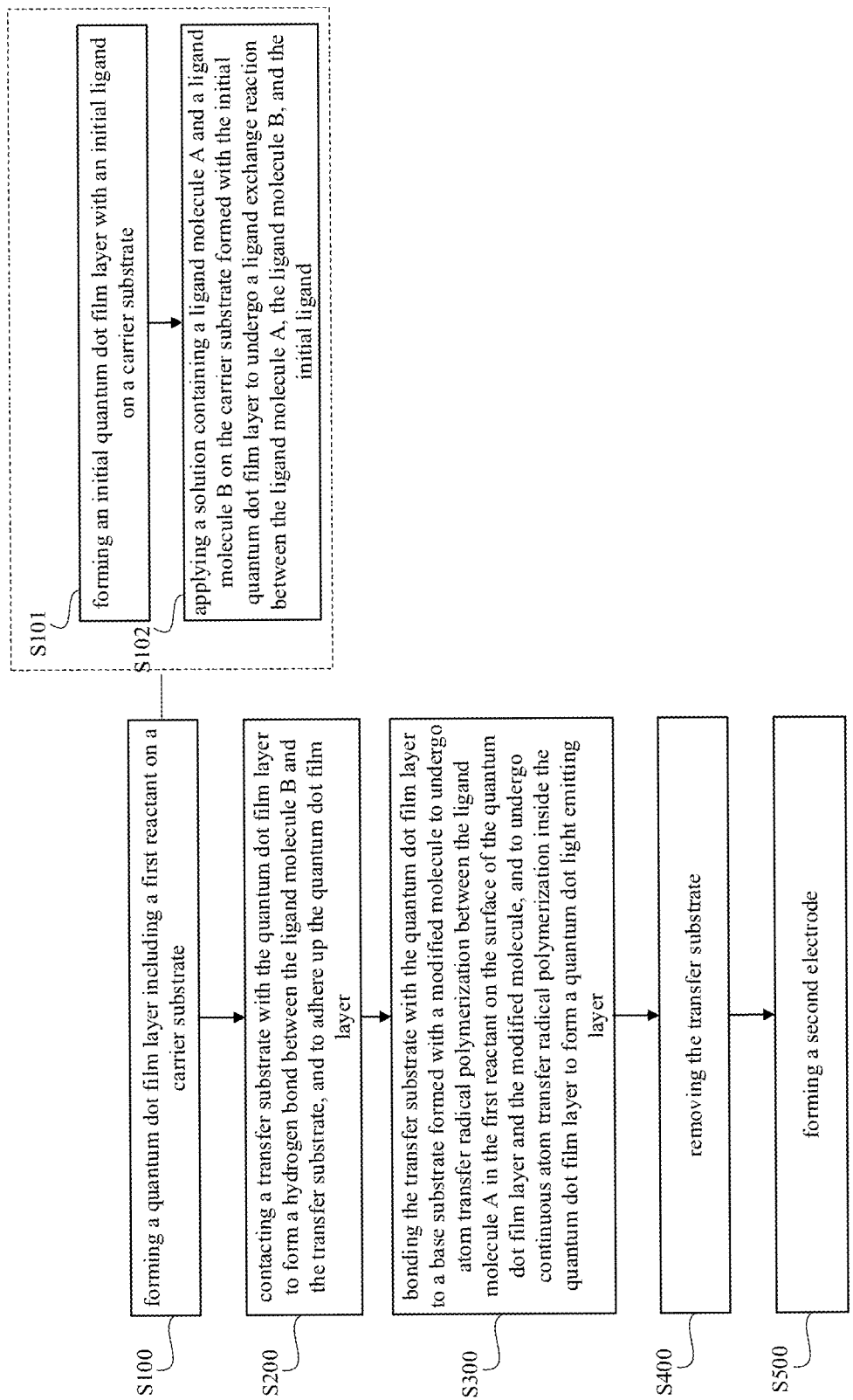
FIG. 4 is a schematic diagram of a manufacturing process of a light emitting diode device provided in an embodiment of the present disclosure.

Referring to FIG. 4, an embodiment of the present disclosure further provides a manufacturing method of a light emitting diode device, including as follows.

S100, forming a quantum dot film layer including a first reactant on a carrier substrate, where the first reactant includes a quantum dot body, a ligand molecule A connected to the quantum dot body, and a ligand molecule B connected to the quantum dot body.

In some embodiments, the first reactant may be formed through a ligand exchange reaction, that is, the step S100 may include a step S101 and a step S102 as follows.

S101, forming an initial quantum dot film layer with an initial ligand on a carrier substrate. In some embodiments, in order to reduce a binding force between the initial quantum dot film layer and the carrier substrate, the carrier substrate may be treated first to reduce the difficulty of subsequently transfer-printing the initial quantum dot film layer to a transfer substrate. That is, the step S101 may include: treating a silicon-based substrate with trimethoxyoctadecylsilane; and forming the initial quantum dot film layer with an oleic acid ligand on the silicon-based substrate, where the oleic acid ligand may be the initial ligand.

S102, applying a solution containing a ligand molecule A and a ligand molecule B on the carrier substrate formed with the initial quantum dot film layer to undergo a ligand exchange reaction between the ligand molecule A, the ligand molecule B, and the initial ligand. The materials of the ligand molecule A and the ligand molecule B may refer to the materials described in the light emitting diode device embodiment provided in embodiments of the present disclosure.

S200, contacting a transfer substrate with the quantum dot film layer to form a hydrogen bond between the ligand molecule B and the transfer substrate, and to adhere up the quantum dot film layer. In the step S200, the ligand molecule B may be formed in advance in the first reactant, and then when the transfer substrate is brought into contact with the quantum dot film layer with the ligand molecule B on the carrier substrate, the ligand molecule B may form a hydrogen bond with the transfer substrate, and as an acting force of the hydrogen bond is greater than a bonding force between the initial quantum dot film layer and the carrier substrate, so that the quantum dot film layer can be adhered up from the carrier substrate.

S300: bonding the transfer substrate with the quantum dot film layer to a base substrate formed with a modified molecule to undergo atom transfer radical polymerization between the ligand molecule A in the first reactant on the surface of the quantum dot film layer and the modified molecule, and to undergo continuous atom transfer radical polymerization inside the quantum dot film layer to form a quantum dot light emitting layer. The base substrate is formed with a first electrode and a carrier functional layer on one side, facing away from the base substrate, of the first electrode, and the modified molecule is connected to one surface, facing way from the first electrode, of the carrier functional layer. In the step S300, in order to catalyze the ATRP reaction between the ligand molecule A and the modified molecule, when the transfer substrate with the quantum dot film layer is bonded to the base substrate formed with the modified molecule, the bonded transfer substrate and base substrate may be immersed in an anisole solution of cuprous chloride.

S400: removing the transfer substrate. It should be noted that when the transfer substrate is removed, the ligand molecule B combined with the transfer substrate may be removed together with the transfer substrate. That is, in the final light emitting diode device, the molecular chain structure in the quantum dot light emitting film layer may not contain the ligand molecule B, and the ligand molecule B exists in the process of transfer-printing the quantum dot film layer to the base substrate during manufacturing of the light emitting diode device. Of course, in view of actual process limitations, the ligand molecule B may not be completely removed, and therefore, part of the ligand molecules B may be remained in the final light emitting diode device.

S500: forming a second electrode on a side, facing away the carrier function layer, of the quantum dot light emitting layer.

In the manufacturing method of the light emitting diode device, which is provided in the embodiment of the present disclosure, firstly, the quantum dot film layer is formed on the carrier substrate with a weak bond to the carrier substrate, and then the transfer substrate is brought into contact with the quantum dot film layer, such that the quantum dot film layer forms the hydrogen bond with a stronger binding force with the transfer substrate than that with the carrier substrate to transfer the quantum dot film layer together with the transfer substrate when the transfer substrate is removed, and one surface of the transfer substrate with the quantum dot film layer is then bonded to the base substrate to undergo the ATRP reaction between the ligand molecule A in the quantum dot film layer and the modified molecule C of the base substrate, as the covalent bond formed by the ATRP reaction has a greater binding force than the hydrogen bond, the quantum dot film layer may be left on the base substrate when the transfer substrate is separated from the base substrate, thus the quantum dot film layer is formed on the base substrate in a transfer-printing mode. Moreover, compared with a mode of transfer-printing the quantum dot film layer in the prior art, the manufacturing method provided in the embodiment of the present disclosure has the advantages that the first reactant of the quantum dot film layer may undergo the ATRP reaction with the modified molecule of the base substrate at the interface between the quantum dot film layer and the carrier functional layer, as well as inside the quantum dot film layer, such that the quantum dot film layer forms a tightly combined whole body, and may be transferred together from the transfer substrate to the base substrate, thereby achieving a high transfer yield of the quantum dot film layer and avoiding the problem that only part of the quantum dot film layer is transferred from the transfer substrate to the base substrate.

Figure 5:
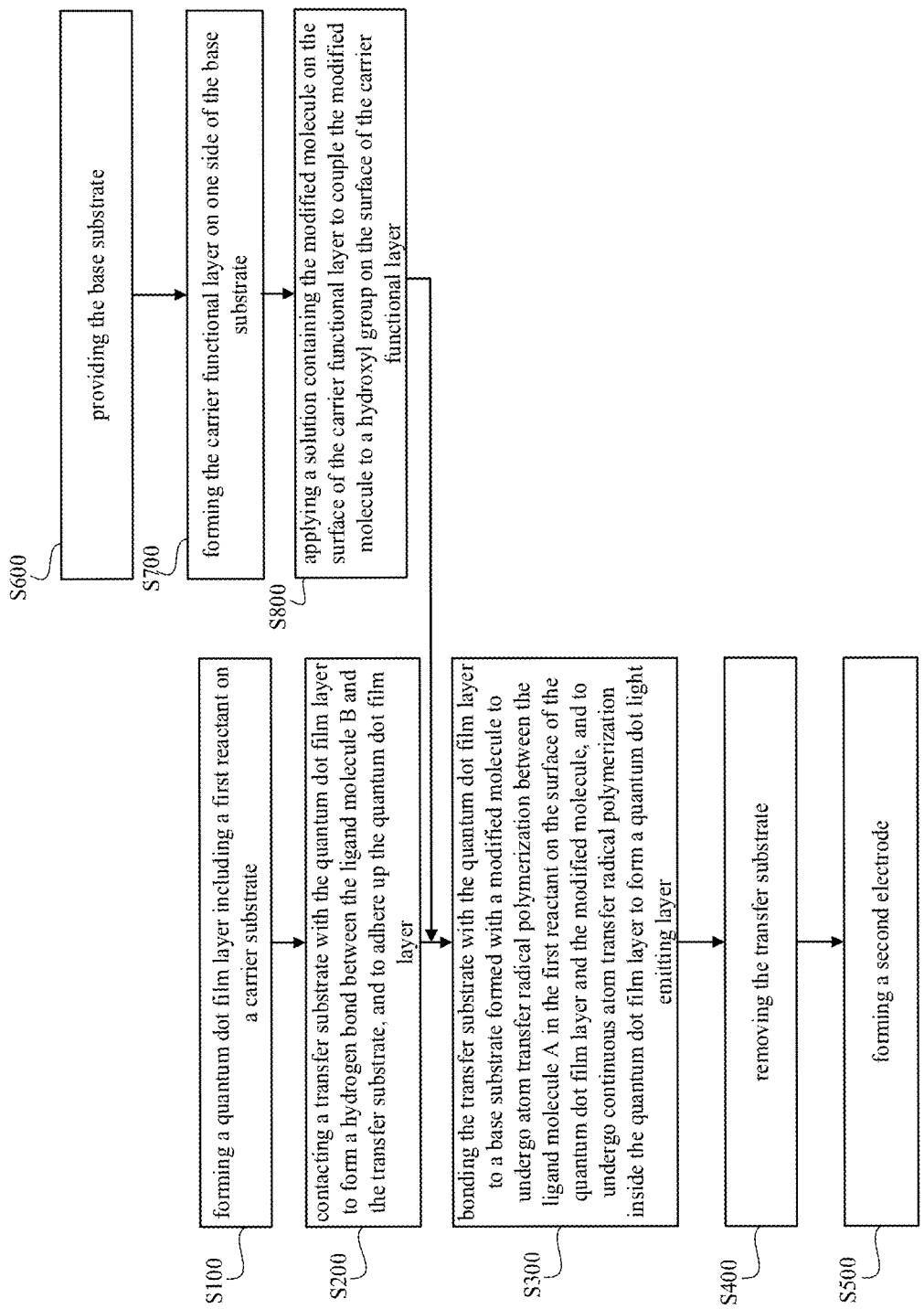
FIG. 5 is a schematic diagram of another manufacturing process of a light emitting diode device provided in an embodiment of the present disclosure.

In some embodiments, in conjunction with FIG. 5, before bonding the transfer substrate with the quantum dot film layer to the base substrate formed with the carrier functional layer connected with the modified molecule, the manufacturing method further includes as follows.

S600, providing the base substrate.

S700, forming the carrier functional layer on one side of the base substrate.

S800, applying a solution containing the modified molecule on the surface of the carrier functional layer to couple the modified molecule to a hydroxyl group on the surface of the carrier functional layer.

Figure 6:
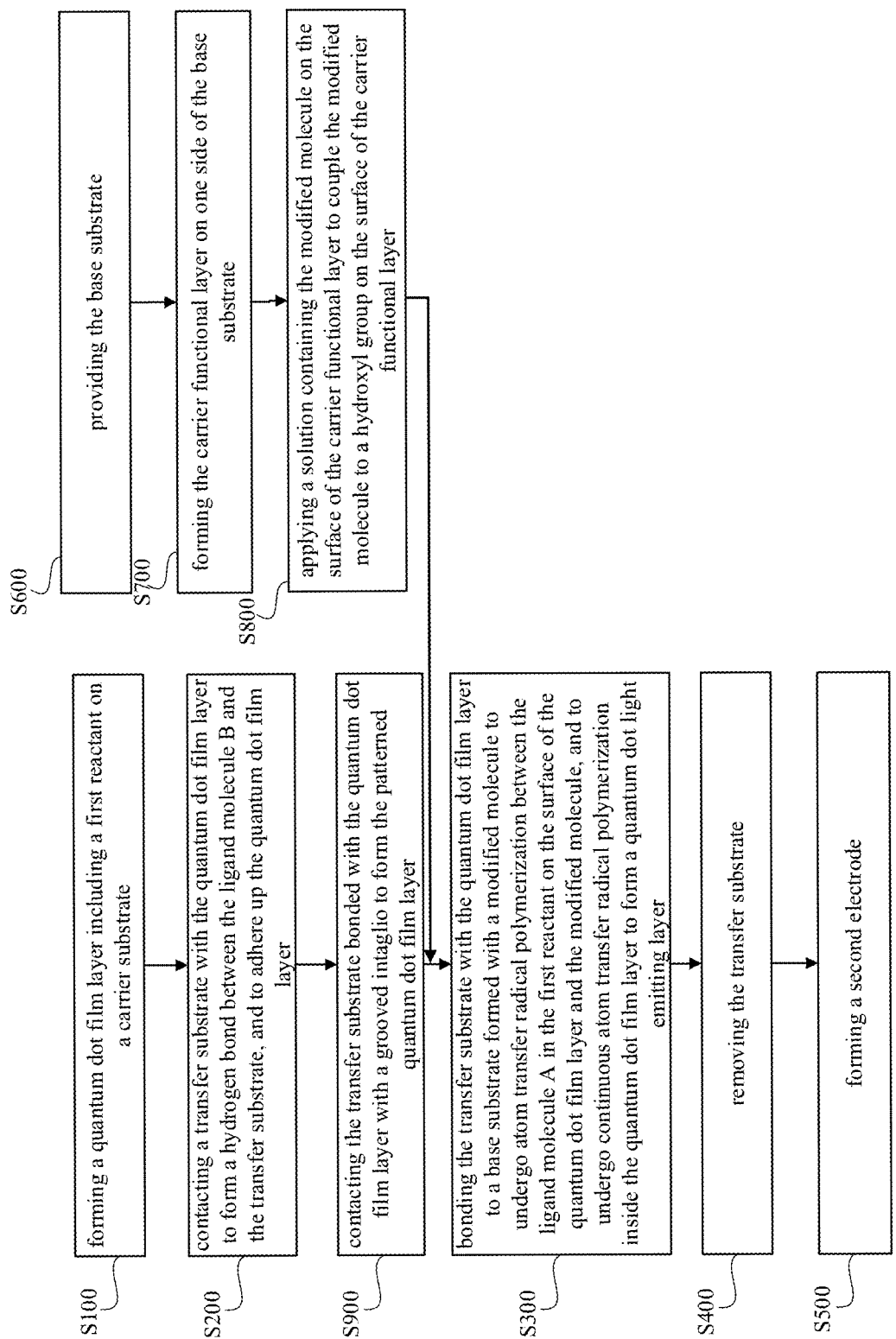
FIG. 6 is a schematic diagram of a manufacturing process of a light emitting diode device formed with a patterned quantum dot film layer, as provided in an embodiment of the present disclosure.

In some embodiments, with reference to FIG. 6, in order to form a patterned quantum dot film layer, after the step S200 and before the step S300, i.e., after adhering up the quantum dot film layer and before bonding the transfer substrate with the quantum dot film layer to the base substrate formed with the modified molecule, the manufacturing method may further include as follows.

Figure 7:
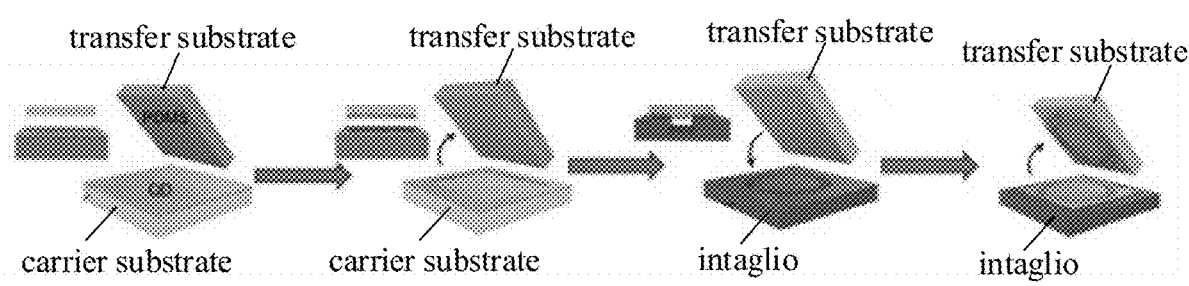
FIG. 7 is a schematic diagram of a transfer process of a quantum dot film layer, as provided in an embodiment of the present disclosure.

S900, contacting the transfer substrate bonded with the quantum dot film layer with a grooved intaglio to form the patterned quantum dot film layer. In conjunction with FIG. 7, after the transfer substrate is brought into contact with the grooved intaglio, the quantum dot film layer with a protrusion at a position corresponding to the groove may be formed on the transfer substrate (i.e., after contact with the intaglio, quantum dots outside the position corresponding to the groove region are left on the intaglio, and the transfer substrate has the quantum dot film layer only at the position corresponding to the groove), and when the quantum dot film layer with the protrusion is transferred to a display substrate, the protruding quantum dot film layer may be aligned with a recessed region of the display substrate, where a light emitting device is located, to form the patterned quantum dot film layer in a light emitting device region defined by barrier walls 7. It is to be noted that FIG. 7 is only a schematic illustration of transfer carried out by using the groove of the intaglio as an annulus. In some embodiments, the shape of the groove of the intaglio may be consistent with a pattern of the region where the light emitting device of the display substrate is located. The above is a mode of forming patterned quantum dots by the intaglio with the groove, in which the transfer substrate is of a whole-layer flat structure before contact with the intaglio. In some embodiments, a patterned transfer substrate (i.e. the transfer substrate has both a protruding part and a recessed part) may also be formed, and when the transfer substrate is in contact with a carrier substrate of an original substrate, the quantum dot film layer may be adsorbed by the transfer substrate at a position where the transfer substrate can contact the quantum dot film layer on the carrier substrate (i.e. the protruding part of the transfer substrate) due to the hydrogen bond formed between the transfer substrate and the quantum dot film layer, while the quantum dot film layer is not adsorbed at a position not in contact with the quantum dot film layer (i.e. the recessed part of the transfer substrate).

Thus, the patterned quantum dot film layer is formed on the transfer substrate, and then the transfer substrate may be brought into direct contact with the display substrate to transfer the patterned quantum dot film layer to the display substrate. In this transfer mode, the pattern of the transfer substrate may be consistent with the pattern of the region where the light emitting device of the display substrate is located.

In some embodiments, the material of the transfer substrate may be PDMS. In the step S200, contacting the transfer substrate with the quantum dot film layer may include: contacting a substrate made of polydimethylsiloxane with the quantum dot film layer. As the material of the transfer substrate is PDMS, and it can form the hydrogen bond with the ligand molecule B in the quantum dot film layer.

To more clearly understand the manufacturing method of the light emitting diode device provided in the embodiment of the present disclosure, in conjunction with FIG. 7, the following description is made with an example in which the light emitting diode device is of the inverted structure.

Preparation of the patterned quantum dot film layer is that: 15 mg/ml of quantum dot solution is spin-coated (at a rotating speed of 2,500 rpm/s) on a silicon-based substrate (carrier substrate) treated with trimethoxyoctadecylsilane; after the spin-coating is completed, a methanol solution (with concentration of 20 mg/ml) of the ligand molecule A and the ligand molecule B is dropped onto the quantum dot film layer for ligand exchange; after standing for 30 s, the methanol is spun off, the surface of the quantum dot film layer is washed for twice with the methanol to remove the excess ligands, and annealing is carried out at the temperature of 120° C. for 20 minutes; and the quantum dot film layer is quickly adhered up by a PDMS substrate (transfer substrate) and brought into contact with the groove of the intaglio to form the patterned quantum dot film layer.

15 mg/ml of zinc oxide (as the subsequently formed carrier functional layer) nanoparticle solution is firstly spin-coated (at a rotating speed of 4,000 rpm/s) on an ITO substrate (base substrate), and annealing is carried out at the temperature of 120° C. for 20 minutes. An ethanol solution of the modified molecule C is placed on the zinc oxide thin film for 5 minutes, then the excess solvent is spun off, and annealing is carried out at the temperature of 100° C. for 10 minutes to accelerate the coupling of a silane reagent and the hydroxyl group on the zinc oxide surface; the patterned quantum dot film layer on the PDMS substrate (transfer substrate) is brought into contact with the surface of the zinc oxide thin film and immersed in an anisole solution containing cuprous chloride to carry out the ATRP reaction at the temperature of 80° C. in an anhydrous and oxygen-free nitrogen atmosphere; after the reaction is completed, washing is performed with anisole to remove redundant impurities, and annealing is carried out at the temperature of 120° C. for 20 minutes; and then, a hole transport layer material and a silver electrode (second electrode) are evaporated above the quantum dot film layer to prepare the patterned quantum dot light emitting diode device.

Preferred embodiments of the present disclosure are described above, but additional variations and modifications can be made to these embodiments by those skilled in the art once they learn basic creative concepts. Therefore, the appended claims are intended to be interpreted as including the preferred embodiments and all variations and modifications within the scope of the present disclosure.

Obviously, those skilled in the art can make various changes and modifications to the embodiments of the present disclosure without departing from the spirit and scope of the embodiments of the present disclosure. As such, the present disclosure is also intended to encompass these changes and modifications if such changes and modifications to the embodiments of the present disclosure are within the scope of the claims of the present disclosure and equivalents thereof.

What is claimed is:

1. A light emitting diode device, comprising:
a base substrate;
a first electrode disposed on one side of the base substrate;
a carrier functional layer disposed on one side, facing away from the base substrate, of the first electrode;
a quantum dot light emitting layer disposed on one side, facing away from the first electrode, of the carrier functional layer, having a molecular chain structure inside, wherein:
the molecular chain structure is formed by atom transfer radical polymerization of a first reactant and a modified molecule,
the first reactant comprises a quantum dot body and a ligand molecule A connected to the quantum dot body,
the first reactant undergoes the atom transfer radical polymerization with the modified molecule through the ligand molecule A, and
the modified molecule, in an initial state, is connected to one surface, facing the quantum dot light emitting layer, of the carrier functional layer; and
a second electrode disposed on one side, facing away from the carrier functional layer, of the quantum dot light emitting layer.

2. The light emitting diode device of claim 1, wherein a general formula of the ligand molecule A is:

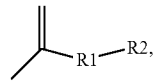

and wherein R1 is an electron-donating group, and R2 is a solubility-enhancing group.

3. The light emitting diode device of claim 2, wherein:
R1 comprises one of:

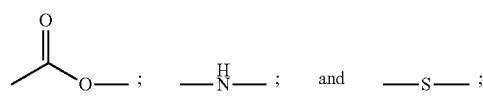

and
R2 comprises one of:

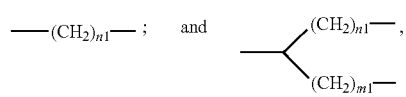

and
wherein $1 \leq n1 \leq 8$, and $1 \leq m1 \leq 8$.

4. The light emitting diode device of claim 1, wherein a general formula of the modified molecule is:

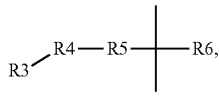

and wherein R3 is a group coupled to the surface of the carrier functional layer, R6 is a halogenated group, and R5 is an electron-donating group.

5. The light emitting diode device of claim 4, wherein:

R3 comprises one of:

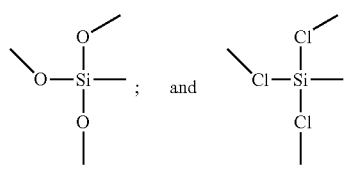

R6 comprises one of:
—Cl;
—Br; and
—I; and

R5 comprises one of:

and

R4 comprises one of:
—$(CH_2)_{n2}$—, and wherein $1 \leq n2 \leq 12$.

6. The light emitting diode device of claim 4, wherein a structure of the quantum dot body connected with the ligand molecule A is:

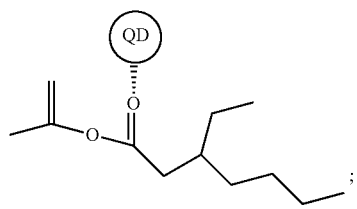

the modified molecule is:

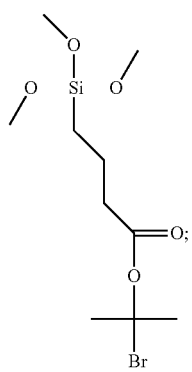

and a chain initiation reaction on a surface, facing the carrier functional layer, of the quantum dot light emitting layer is:

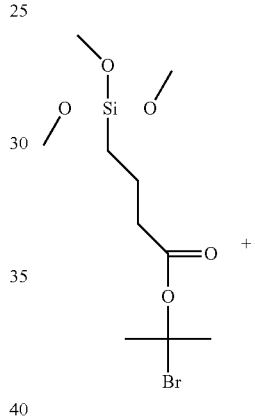

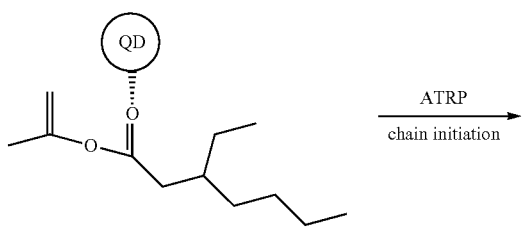

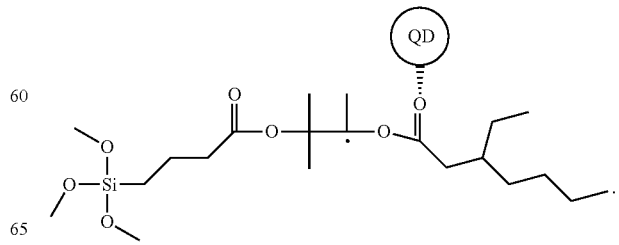

7. The light emitting diode device of claim 6, wherein the molecular chain structure is:

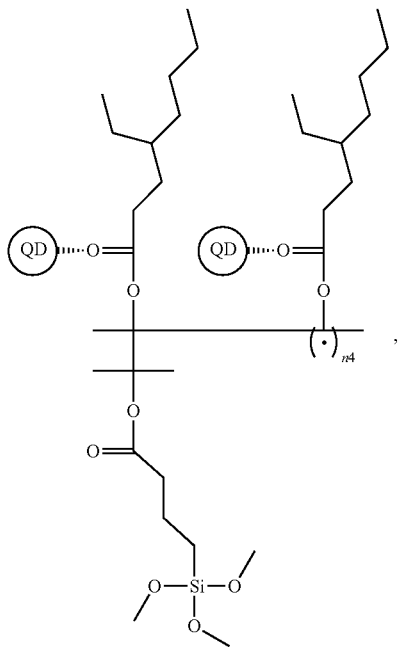

wherein n4≥1; and a chain propagation reaction inside the quantum dot light emitting layer is:

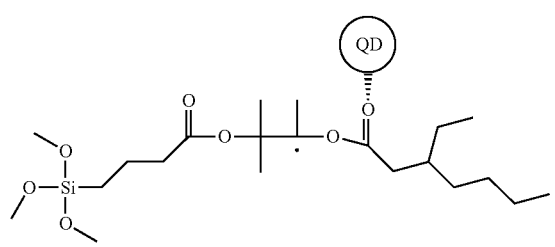

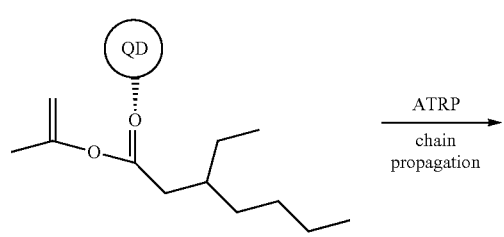

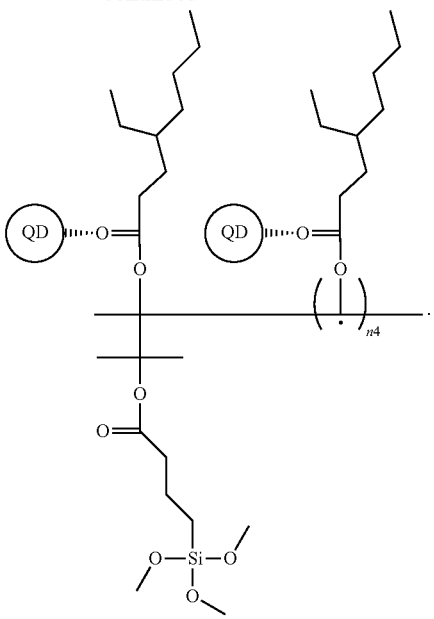

8. The light emitting diode device of claim 1, wherein the first reactant comprises a ligand molecule B, and a general formula of ligand molecule B is:

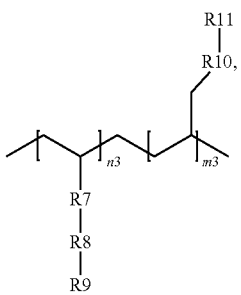

and wherein 1≤n3≤12, 1≤m3≤12, R9 is a group coordinated with the quantum dot body, and R11 is a group that forms a hydrogen bond with a transfer substrate when the quantum dot light emitting layer is transfer-printed.

9. The light emitting diode device of claim 8, wherein R9 comprises one of:

—NH$_2$;

—SH; and

—COOH.

10. The light emitting diode device of claim 8, wherein R11 comprises one of:

—CHO;

—OH; and

—COOH.

11. The light emitting diode device of claim 8, wherein:

R7 comprises one of:

—O—;

—N—;

—C—; and

—S—;

R8 comprises one of:
—(CH$_2$)a—, and wherein a=1, 2, 3 or 4; and
R10 comprises one of:
—(CH$_2$)b—; and

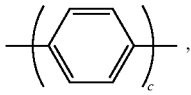

and wherein 1≤b≤8, and c=1 or 2.

12. The light emitting diode device of claim 1, wherein a material of the carrier functional layer is an inorganic metal oxide, and a surface of the inorganic metal oxide has a hydroxyl group.

13. The light emitting diode device of claim 12, wherein:
the first electrode is a cathode,
the second electrode is an anode, and
the carrier functional layer is an electron transport layer, and
a material of the electron transport layer is zinc oxide;
or wherein:
the first electrode is an anode,
the second electrode is a cathode,
the carrier functional layer is a hole transport layer, and
a material of the hole transport layer is nickel oxide.

14. A manufacturing method of a light emitting diode device, comprising:
forming a quantum dot film layer comprising a first reactant on a carrier substrate,
wherein the first reactant comprises a quantum dot body, a ligand molecule A connected to the quantum dot body, and a ligand molecule B connected to the quantum dot body;
contacting a transfer substrate with the quantum dot film layer to form a hydrogen bond between the ligand molecule B in the first reactant and the transfer substrate, and to adhere up the quantum dot film layer;
bonding the transfer substrate with the quantum dot film layer to a base substrate formed with a modified molecule to undergo atom transfer radical polymerization between the ligand molecule A in the first reactant on a surface of the quantum dot film layer and the modified molecule, and to undergo continuous atom transfer radical polymerization inside the quantum dot film layer to form a quantum dot light emitting layer,
wherein the base substrate is formed with a first electrode and a carrier functional layer on one side, facing away from the base substrate, of the first electrode, and
the modified molecule is connected to one surface, facing away from the first electrode, of the carrier functional layer;
removing the transfer substrate; and
forming a second electrode on a side, facing away the carrier functional layer, of the quantum dot light emitting layer.

15. The manufacturing method of claim 14, wherein the forming the quantum dot film layer comprising the first reactant on the carrier substrate comprises:
forming an initial quantum dot film layer with an initial ligand on the carrier substrate; and
applying a solution containing the ligand molecule A and the ligand molecule B on the carrier substrate formed with the initial quantum dot film layer to undergo a ligand exchange reaction between the ligand molecule A, the ligand molecule B and the initial ligand.

16. The manufacturing method of claim 15, wherein the forming the initial quantum dot film layer with the initial ligand on the carrier substrate comprises:
treating a silicon-based substrate with trimethoxyoctadecylsilane; and
forming the initial quantum dot film layer with an oleic acid ligand on the silicon-based substrate.

17. The manufacturing method of claim 14, wherein before bonding the transfer substrate with the quantum dot film layer to the base substrate formed with the carrier functional layer connected with the modified molecule, further comprising:
providing the base substrate;
forming the carrier functional layer on one side of the base substrate; and
applying a solution containing the modified molecule on a surface of the carrier functional layer to couple the modified molecule to a hydroxyl group on the surface of the carrier functional layer.

18. The manufacturing method of claim 17, wherein after adhering up the quantum dot film layer and before bonding the transfer substrate with the quantum dot film layer to the base substrate formed with the modified molecule, further comprising:
contacting the transfer substrate bonded with the quantum dot film layer with a grooved intaglio to form a patterned quantum dot film layer.

19. The manufacturing method of claim 14, wherein when bonding the transfer substrate with the quantum dot film layer to the base substrate formed with the modified molecule, the manufacturing method further comprises:
immersing the bonded transfer substrate and base substrate in an anisole solution of cuprous chloride.

20. The manufacturing method of claim 14, wherein the contacting the transfer substrate with the quantum dot film layer comprises:
contacting the transfer substrate made of polydimethylsiloxane with the quantum dot film layer.

* * * * *